US012800637B2

(12) United States Patent
Hung et al.

(10) Patent No.: US 12,800,637 B2
(45) Date of Patent: Nov. 17, 2026

(54) ANTENNA TEST ASSEMBLY AND METHOD THEREOF

(71) Applicant: Universal Scientific Industrial (Shanghai) Co., Ltd., Shanghai (CN)

(72) Inventors: Hao Liang Hung, Shanghai (CN); Chun Ying Huang, Shanghai (CN); Yu Cheng Liu, Shanghai (CN)

(73) Assignee: Universal Scientific Industrial (Shanghai) Co., Ltd., Shanghai (CN)

( * ) Notice: Subject to any disclaimer, the term of this patent is extended or adjusted under 35 U.S.C. 154(b) by 163 days.

(21) Appl. No.: 18/923,696

(22) Filed: Oct. 23, 2024

(65) Prior Publication Data

US 2025/0155485 A1 May 15, 2025

(30) Foreign Application Priority Data

Nov. 15, 2023 (CN) ........................ 202311524966.0

(51) Int. Cl.
*G01R 29/08* (2006.01)

(52) U.S. Cl.
CPC ..... *G01R 29/0871* (2013.01); *G01R 29/0878* (2013.01)

(58) Field of Classification Search
CPC ................ G01R 29/08; G01R 29/0864; G01R 29/0871; G01R 29/0878; G01R 29/10; G01R 29/105; G01R 31/28; G01R 31/2801; G01R 31/282; G01R 31/2829; G01R 31/2851; G01R 31/2884; G01R 31/50; G01R 35/00
See application file for complete search history.

(56) References Cited

U.S. PATENT DOCUMENTS

2006/0197538 A1* 9/2006 Leinonen ............... H01Q 1/243 324/533
2006/0279305 A1* 12/2006 Kim ................... G01R 31/2889 324/756.02
2013/0271328 A1* 10/2013 Nickel ................... G01R 29/10 343/703
2018/0052195 A1* 2/2018 Duke ................. G01R 31/2884
2019/0113556 A1* 4/2019 Kao ........................ G01R 29/10
2019/0267716 A1* 8/2019 Yoon .................. H01Q 13/0233
2019/0310314 A1* 10/2019 Liu ..................... G01R 31/2863
2019/0372687 A1* 12/2019 Nagata ............... G01R 29/0878
2020/0313725 A1* 10/2020 Abdulai ............. G01R 29/0878

FOREIGN PATENT DOCUMENTS

TW 201812314 A 4/2018

* cited by examiner

*Primary Examiner* — Alvaro E Fortich
*Assistant Examiner* — David B Frederiksen
(74) *Attorney, Agent, or Firm* — CKC & Partners Co., LLC

(57) ABSTRACT

An antenna test assembly includes a DUT (Device under Test). The DUT includes an antenna module and a circuit board. The antenna module includes a first antenna element, which includes a first antenna pin and a second antenna pin. The circuit board includes a first line and a second line, and two ends of each of the first line and the second line are electrically connected to two metal pads, respectively, exposed on the circuit board. When the antenna test assembly is in an equipment test mode, the first line, the first antenna pin, the second antenna pin and the second line are electrically connected in sequence.

8 Claims, 4 Drawing Sheets

ANTENNA TEST ASSEMBLY AND METHOD THEREOF

RELATED APPLICATIONS

This application claims priority to China Application Serial Number 202311524966.0, filed on Nov. 15, 2023, which is herein incorporated by reference.

BACKGROUND

Technical Field

The present disclosure relates to an antenna test assembly and an antenna test method. More particularly, the present disclosure relates to an antenna test assembly and an antenna test method applying in a dual-port antenna.

Description of Related Art

Driven by human beings' pursuit of convenient life, various wireless communication systems and their RF (Radio Frequency) technologies have been developed, such as the rise of 5G mmWave (millimeter wave) technology in recent years, thereby the quality verification of 5G mmWave AoP (Antenna On Package) modules has become an important part. However, due to the influence of production process factors, the warpage phenomenon caused by heating of components easily leads to the risk of non-wetting/poor soldering between the 5G mmWave AoP module and the circuit board. Further, the short wavelength of high-frequency signals makes such problems difficult to detect accurately.

Therefore, how to quickly detect and analyze the problems of the AoP modules, such as how to detect the non-wetting/poor soldering of its pins, and effectively reduce the production cost, has become an important issue in today's market.

SUMMARY

According to one aspect of the present disclosure, an antenna test assembly includes a DUT (Device under Test). The DUT includes an antenna module and a circuit board. The antenna module includes a first antenna element, which includes a first antenna pin and a second antenna pin. The circuit board includes a first line and a second line, and two ends of each of the first line and the second line are electrically connected to two metal pads, respectively, exposed on the circuit board. When the antenna test assembly is in an equipment test mode, the first line, the first antenna pin, the second antenna pin and the second line are electrically connected in sequence.

According to another aspect of the present disclosure, an antenna test method includes: providing a DUT, which includes an antenna module and a circuit board, wherein the antenna module includes a first antenna element and a second antenna element, the first antenna element includes a first antenna pin and a second antenna pin, the second antenna element includes a third antenna pin and a fourth antenna pin, the circuit board includes a first line, a second line, a third line and a fourth line, and two ends of each of the first line, the second line, the third line and the fourth line are electrically connected to two metal pads, respectively, exposed on the circuit board; providing a first conductive element, a second conductive element, a third conductive element and a fourth conductive element; causing a first test pin and a first RF pin of the first conductive element to be electrically conducted to each other, causing a second test pin and a second RF pin of the second conductive element to be electrically conducted to each other, causing a third test pin and a third RF pin of the third conductive element to be electrically conducted to each other, and causing a fourth test pin and a fourth RF pin of the fourth conductive element to be electrically conducted to each other; electrically connecting the second test pin and the third test pin in a conductive manner; inputting a first RF signal into the first test pin; causing the first RF signal to pass through an equipment test path formed in sequence by the first test pin, the first RF pin, the first line, the first antenna pin, the second antenna pin, the second line, the second RF pin, the second test pin, the third test pin, the third RF pin, the third line, the third antenna pin, the fourth antenna pin, the fourth line, the fourth RF pin and the fourth test pin, and causing the fourth test pin to output a signal parameter; providing a signal standard range; comparing the signal parameter and the signal standard range; and determining whether there is a poor connection on the equipment test path.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1A:
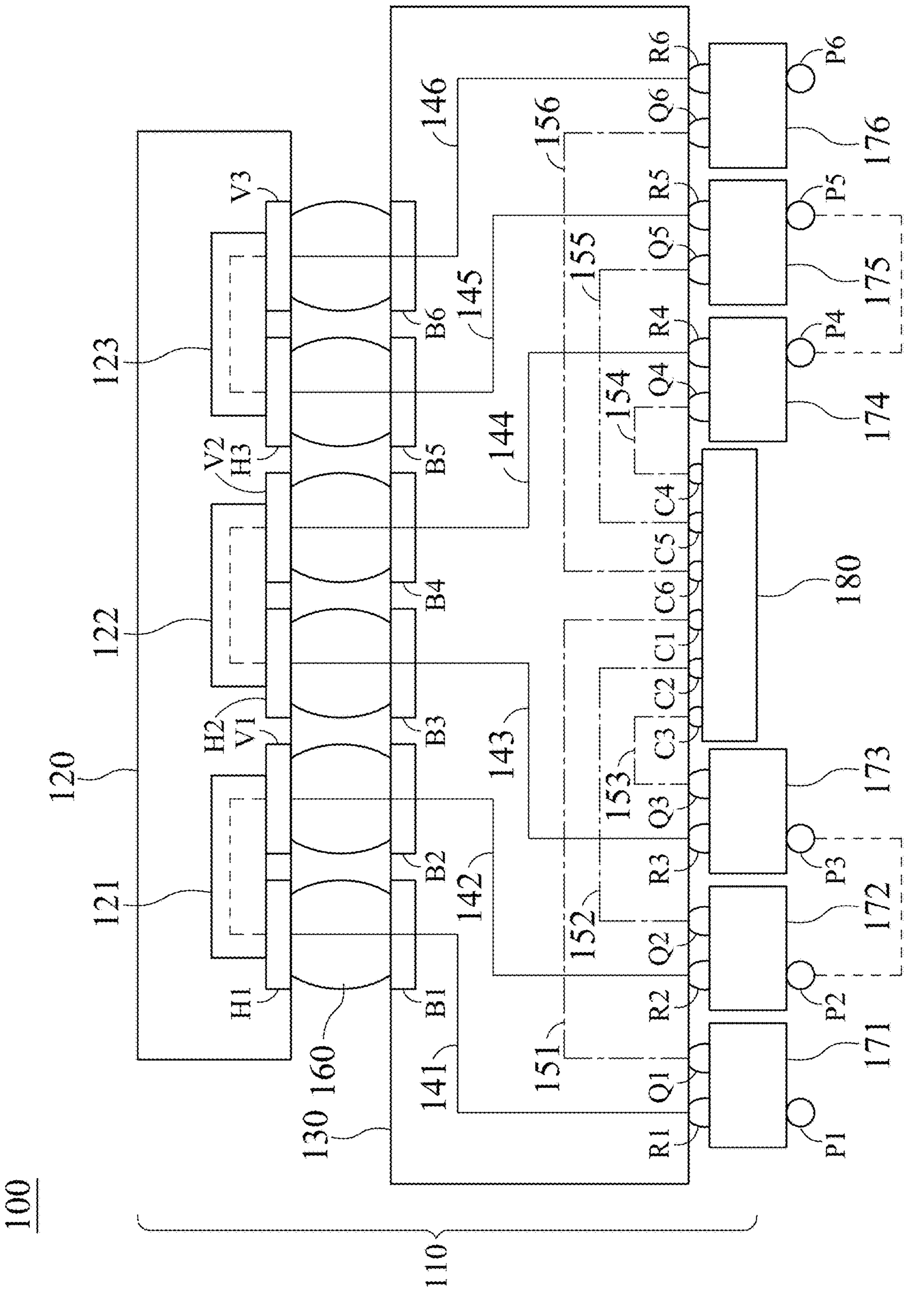
FIG. 1A is a schematic view of an antenna test assembly according to the first embodiment of the present disclosure.

FIG. 1A is a schematic view of an antenna test assembly 100 according to the first embodiment of the present disclosure. With reference to FIG. 1A, the antenna test assembly 100 includes a DUT (Device under Test) 110. The DUT 110 includes an antenna module 120 and a circuit board 130. The antenna module 120 includes a first antenna element 121, which includes a first antenna pin H1 and a second antenna pin V1. Each of the first antenna pin H1 and the second antenna pin V1 is an antenna port of the first antenna element 121, and the antenna module 120 may be a 5G mmWave AoP module. The circuit board 130 includes a first line (first circuit line) 141 and a second line 142. The upper end and the lower end of the first line 141 in FIG. 1A are electrically connected to the metal pad B1 exposed on the circuit board 130 and the metal pad (not labeled) contacting the first RF pin R1 of the first conductive element 171, respectively. The upper end and the lower end of the second line 142 in FIG. 1A are electrically connected to the metal pad B2 exposed on the circuit board 130 and the metal pad (not labeled) contacting the second RF pin R2 of the second conductive element 172, respectively. Furthermore, the pins of the present disclosure may be in the forms of conductive patches or conductive frames, and are not limited thereto.

Figure 1B:
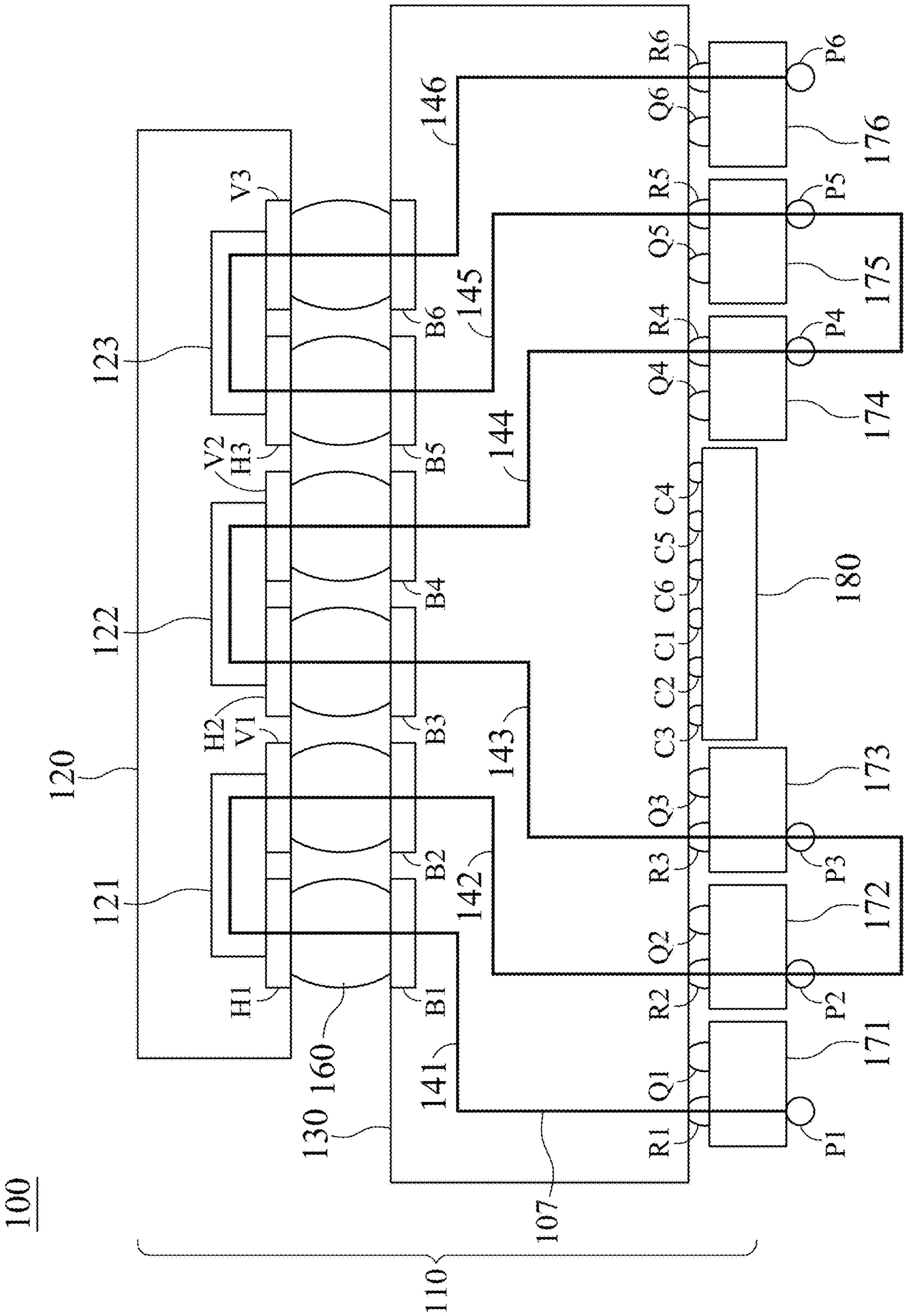
FIG. 1B is a schematic view of an equipment test path of the antenna test assembly in FIG. 1A.

FIG. 1B is a schematic view of an equipment test path 107 of the antenna test assembly 100 in FIG. 1A. With reference to FIG. 1B, when the antenna test assembly 100 is in an equipment test mode, the first line 141, the first antenna pin H1, the second antenna pin V1 and the second line 142 are electrically connected in sequence in a conductive matter. The metal pad B1 and the first antenna pin H1 are electrically connected by soldering through an electrical connection material 160 (e.g., a solder paste, but not limited thereto), and the metal pad B2 and the second line 142 are electrically connected by soldering through another electrical connection material 160. Furthermore, the metal pad located at the lower end of each of the first line 141 and the second line 142 in FIG. 1A may be electrically connected to a test equipment to measure an electrical parameter such as impedance, insertion loss, and not limited thereto. Therefore, the first conductive element 171, the first line 141 and the second line 142 form at least part of the equipment test path 107 shown in FIG. 1B, and the equipment test path 107 is an integral daisy-chain series connection design. It is beneficial to non-destructively measure the electrical parameters at two ends of the equipment test path 107, so as to evaluate whether the elements or the connections between the elements on the equipment test path 107 are normal.

In detail, the antenna test assembly 100 may further include a first conductive element 171 and a second conductive element 172. The first conductive element 171 includes a first test pin P1 and a first RF (Radio Frequency) pin R1, and the second conductive element 172 includes a second test pin P2 and a second RF pin R2. When the antenna test assembly 100 is in the equipment test mode shown in FIG. 1B, the first test pin P1 and the first RF pin R1 are electrically conducted to each other, and the second RF pin R2 and the second test pin P2 are electrically conducted to each other. Therefore, the design of introducing conductive elements and combining them with the DUT 110 to form a daisy-chain is beneficial to expand the application and increase the flexibility of the antenna test assembly 100.

Figure 2:
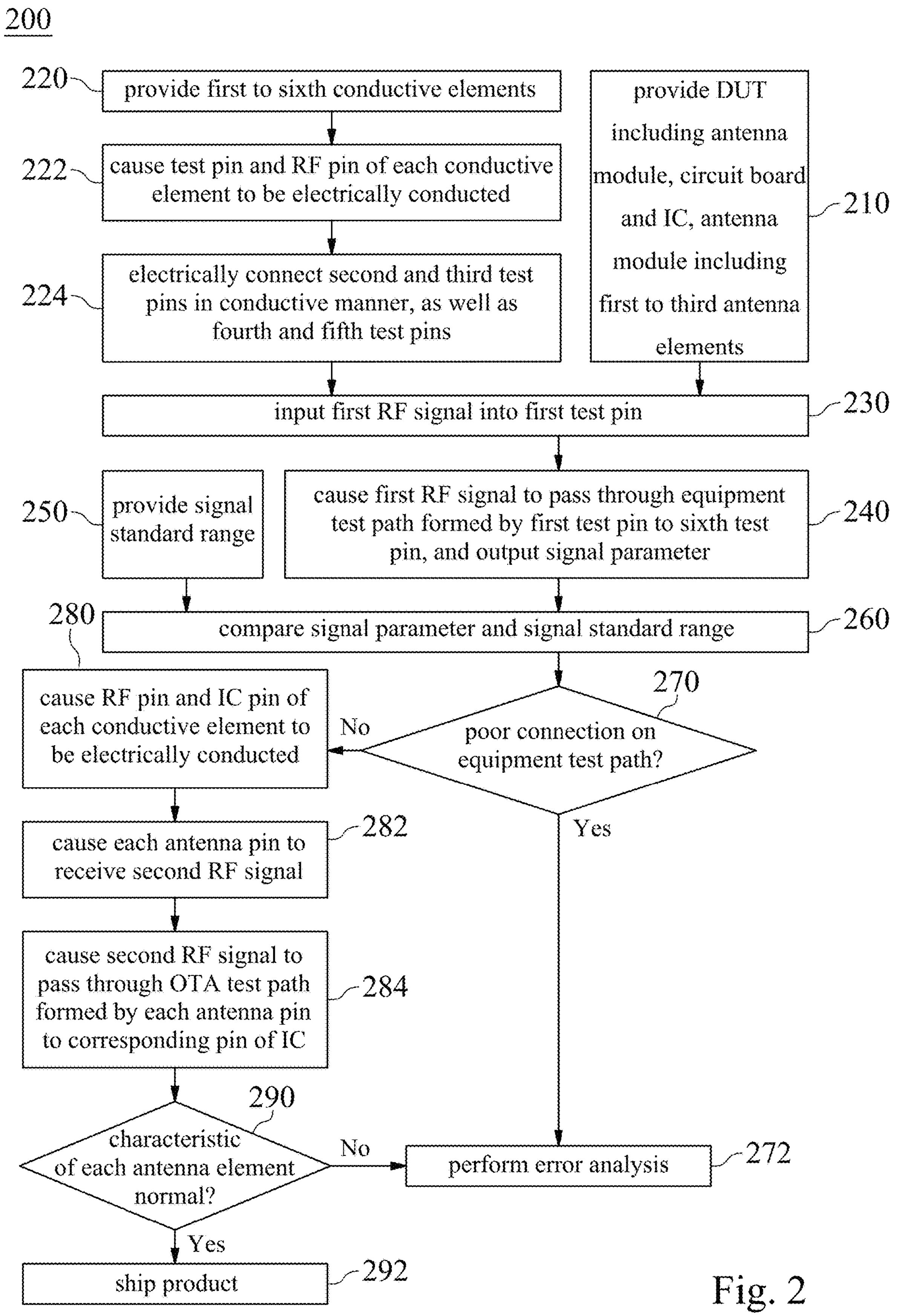
FIG. 2 is a flow chart of an antenna test method according to the second embodiment of the present disclosure.

FIG. 2 is a flow chart of an antenna test method 200 according to the second embodiment of the present disclosure. The antenna test assembly 100 of the first embodiment and the antenna test method 200 of the second embodiment of the present disclosure will be described together in the following. It should be noted that the antenna test assembly 100 is not limited to the application of the antenna test method 200, and the antenna test method 200 is not limited to the application of the antenna test assembly 100. With reference to FIG. 1B and FIG. 2, the antenna test method 200 includes steps 210, 220, 222, 224, 230, 240, 250, 260, 270.

The step 210 includes providing the DUT 110, which includes the antenna module 120 and the circuit board 130 and may include an integrated circuit (IC) 180. The antenna module 120 includes the first antenna element 121 and the second antenna element 122 and may include a third antenna element 123. According to the antenna testing assembly and the antenna testing method of the present disclosure, a number of antenna elements of an antenna module may be more than two.

Specifically, the first antenna element 121, the second antenna element 122 and the third antenna element 123 may be the same and have an operating frequency in a range of 20 GHz to 100 GHz. Therefore, the first antenna element 121, the second antenna element 122 and the third antenna element 123 may form a 5G mmWave antenna array.

The second antenna element 122 includes a third antenna pin H2 and a fourth antenna pin V2, and the third antenna element 123 includes a fifth antenna pin H3 and a sixth antenna pin V3. One of the first antenna pin H1 and the second antenna pin V1 may be a horizontal polarization pin, and the other of the first antenna pin H1 and the second antenna pin V1 may be a vertical polarization pin. Therefore, each of the first antenna element 121, the second antenna element 122 and the third antenna element 123 is a dual-port antenna or dual-polarization antenna, so as to realize the daisy-chain design of the antenna test assembly 100.

The antenna module 120 may be a patch antenna array or an array of patch antennas. In other words, the first antenna element 121, the second antenna element 122 and the third antenna element 123 may form a patch antenna array, and the shape of each antenna element may be in a rectangular shape or other shapes. Therefore, the antenna module 120 has the advantages of simple structure and easy manufacturing. The performance can be fine-tuned easily by controlling the length and width, and the two antenna pins (polarization pins) of each antenna element can be electrically connected through the antenna element itself in a conductive manner, thereby facilitating the implementation of the daisy-chain design of the antenna test assembly 100.

The circuit board 130 further includes a third line 143, a fourth line 144, a fifth line 145 and a sixth line 146. Two ends of the third line 143 are electrically connected to the metal pad B3 exposed on the circuit board 130 and the metal pad contacting the third RF pin R3 of the third conductive element 173, respectively. Two ends of the fourth line 144 are electrically connected to the metal pad B4 exposed on the circuit board 130 and the metal pad contacting the fourth RF pin R4 of the fourth conductive element 174, respectively. Two ends of the fifth line 145 are electrically connected to the metal pad B5 exposed on the circuit board 130 and the metal pad contacting the fifth RF pin R5 of the fifth conductive element 175, respectively. Two ends of the sixth line 146 are electrically connected to the metal pad B6 exposed on the circuit board 130 and the metal pad contacting the sixth RF pin R6 of the sixth conductive element 176, respectively.

The step 220 includes providing the first conductive element 171, the second conductive element 172, the third conductive element 173, the fourth conductive element 174, the fifth conductive element 175 and the sixth conductive element 176, which may be all mmWave switches and electrically connected to the corresponding metal pads on the circuit board through a fixture or welding. Therefore, the antenna test assembly 100 is advantageous in providing various test paths such as the equipment test path and an OTA (Over-The-Air) test path. Furthermore, each conductive element may be a single element, or all conductive elements may be integrated into a switch module.

When the antenna test assembly 100 is in the equipment test mode shown in FIG. 1B, the step 222 includes, by switching, causing the first test pin P1 and the first RF pin R1 of the first conductive element 171 to be electrically conducted to each other, causing the second test pin P2 and the second RF pin R2 of the second conductive element 172 to be electrically conducted to each other, causing the third test pin P3 and the third RF pin R3 of the third conductive element 173 to be electrically conducted to each other, causing the fourth test pin P4 and the fourth RF pin R4 of the fourth conductive element 174 to be electrically conducted to each other, causing the fifth test pin P5 and the fifth RF pin R5 of the fifth conductive element 175 to be electrically conducted to each other, and causing the sixth test pin P6 and the sixth RF pin R6 of the sixth conductive element 176 to be electrically conducted to each other.

When the antenna test assembly 100 is in the equipment test mode shown in FIG. 1B, the step 224 includes electrically connecting the second test pin P2 and the third test pin P3 in a conductive manner, and electrically connecting the fourth test pin P4 and the fifth test pin P5 in a conductive manner.

With reference to FIG. 1B, the step 230 includes inputting a first RF signal into the first test pin P1. The step 240 includes causing the first RF signal to pass through the equipment test path 107 formed in a conductive manner in sequence by the first test pin P1, the first RF pin R1, the first line 141, the first antenna pin H1, the second antenna pin V1, the second line 142, the second RF pin R2, the second test pin P2, the third test pin P3, the third RF pin R3, the third line 143, the third antenna pin H2, the fourth antenna pin V2, the fourth line 144, the fourth RF pin R4, the fourth test pin P4, the fifth test pin P5, the fifth RF pin R5, the fifth line 145, the fifth antenna pin H3, the sixth antenna pin V3, the sixth line 146, the sixth RF pin R6 and the sixth test pin P6, and causing the sixth test pin P6 to output a signal parameter, e.g., impedance, and not limited thereto. Therefore, a complete daisy-chain design in the antenna test assembly 100 is formed. In addition, when the antenna test assembly according to the present disclosure includes only two antenna elements, the corresponding step includes causing the first RF signal to pass through the equipment test path formed in a conductive manner in sequence by the first test pin to the fourth test pin, and causing the fourth test pin to output a signal parameter.

The step 250 includes providing a signal standard range (i.e., a signal standard range of the product within the acceptance criteria). The step 260 includes comparing the signal parameter and the signal standard range. The step 270 includes determining whether there is a poor connection on the equipment test path 107. Therefore, it is different from the conventional detection manners such as P-lapping and X-section that destroy the DUT, and X-ray detection that requires additional manpower. The present disclosure proposes a board level reliability (BLR) method of an improved daisy-chain design to verify the solder joint strength of the 5G mmWave AoP module to detect the occurrence of non-wetting/poor soldering problems. The RF pin and the test pin corresponding to each antenna element are electrically conducted to each other by introducing and switching of the mmWave switch, the daisy-chain design is connected in series to achieve impedance measurement, thereby the impedance change can be used to determine whether at least one of the solder joints (that is, the six solder joints in total, e.g., the solder joint between the first antenna pin H1 and the metal pad B1, etc. in FIG. 1B) between the antenna element and the circuit board 130 has failed. Thus, it is advantageous in quickly detecting, further improving and analyzing.

Figure 1C:
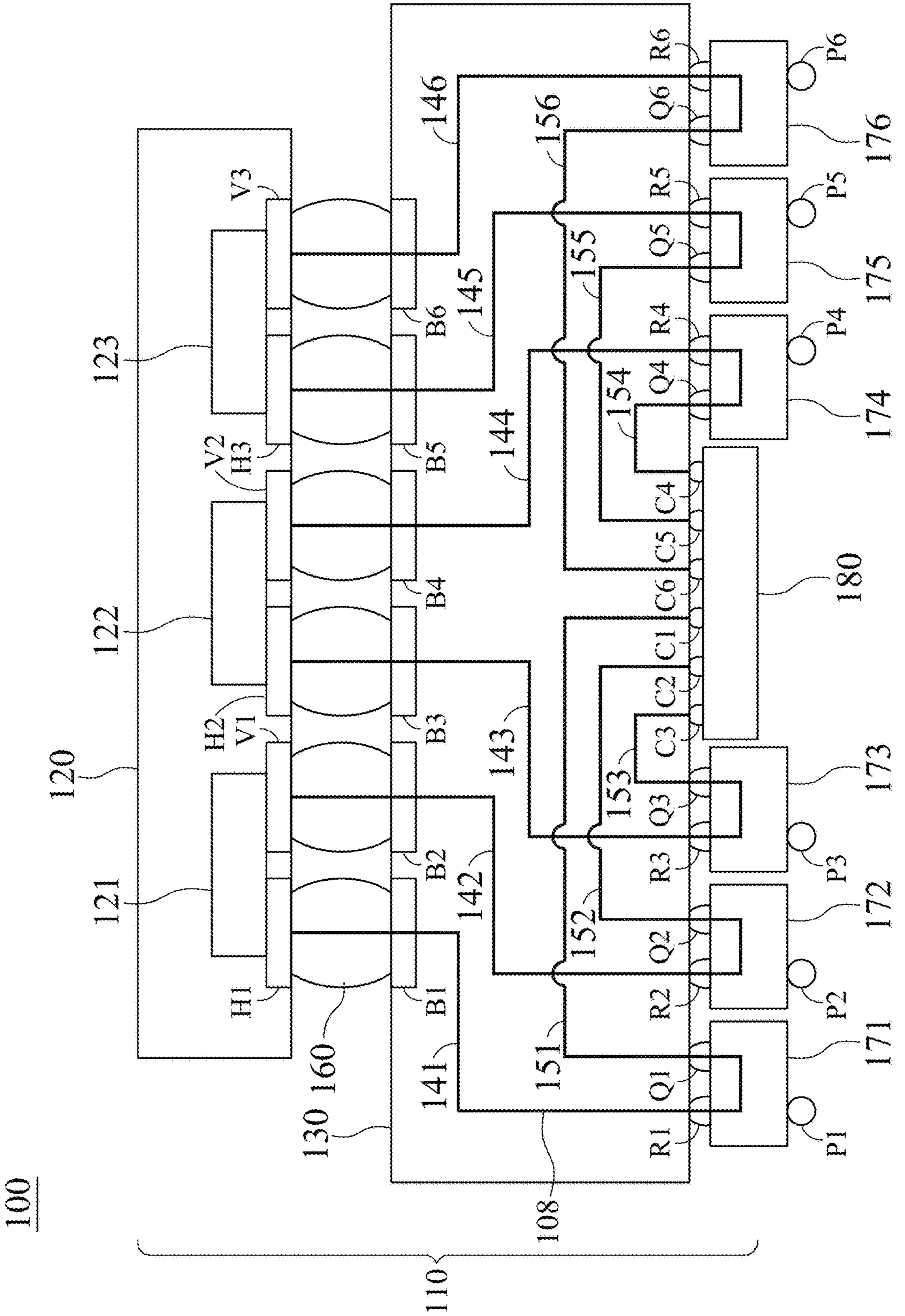
FIG. 1C is a schematic view of an OTA (Over-The-Air) test path of the antenna test assembly in FIG. 1A.

FIG. 1C is a schematic view of the OTA test path 108 of the antenna test assembly 100 in FIG. 1A. With reference to FIG. 1C and FIG. 2, the antenna test method 200 may further include steps 272, 280, 282, 284, 290, 292.

When it is determined that there is a poor connection on the equipment test path 107 in the step 270, the step 272 follows to be performed. The step 272 includes performing error analysis.

When it is determined that there is a poor connection on the equipment test path 107 in the step 270, the step 280 follows to be performed. When the antenna test assembly 100 is in the OTA test mode shown in FIG. 1C, the step 280 includes, by switching, causing the first RF pin R1 and a first IC pin Q1 of the first conductive element 171 to be electrically conducted to each other.

When the antenna test assembly 100 is in the OTA test mode shown in FIG. 1C, the step 282 includes causing the first antenna pin H1 to receive a second RF signal, and the step 284 includes causing the second RF signal to pass through the OTA test path 108 formed in a conductive manner in sequence by the first antenna pin H1, the first line 141, the first RF pin R1, the first IC pin Q1, the line 151 of the circuit board 130 and the pin C1 of the integrated circuit 180. In addition, the integrated circuit 180 is a RF integrated circuit. It should be understood that the relative positional relationship between the antenna module and the integrated circuit of the antenna test assembly according to the present disclosure is not limited to those disclosed in the drawings, and the pin configuration is also not limited to those disclosed in the drawings.

The step 290 includes determining whether a characteristic of the first antenna element 121 is normal. Furthermore, as shown in FIG. 1C, the circuit board 130 further includes lines 152, 153, 154, 155, 156, the integrated circuit 180 further includes pins C2, C3, C4, C5, C6, the second conductive element 172 further includes a second IC pin Q2, the third conductive element 173 further includes a third IC pin Q3, the fourth conductive element 174 further includes a fourth IC pin Q4, the fifth conductive element 175 further includes a fifth IC pin Q5, and the sixth conducting element 176 further includes a sixth IC pin Q6. With reference to the aforementioned steps 280, 282, 284, 290, it can be determined whether characteristics of the first antenna element 121, the second antenna element 122 and the third antenna element 123 (that is, the entire antenna module 120) are normal through six OTA test paths 108 shown in FIG. 1C. Therefore, after no poor connection on the equipment test path 107 determined in the step 270, the RF related characteristics of each antenna element are further measured through switching paths of each conductive element and applying OTA technology, so as to determine whether the antenna module 120 is normal, thereby improving the measurement uncertainty of OTA technology and enhancing the reliability and efficiency of product verification.

When it is determined that the characteristic of each antenna element of the antenna module 120 is normal in the step 290, the step 292 follows to be performed, and the step 292 includes shipping product. When it is determined that the characteristic of at least one antenna element of the antenna module 120 is abnormal in the step 290, the step 272 follows to be performed, and the step 272 includes performing error analysis.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An antenna test assembly, comprising:

a DUT (Device under Test) comprising an antenna module and a circuit board, wherein the antenna module comprises a first antenna element and a second antenna element, the first antenna element comprises a first antenna pin and a second antenna pin, the second antenna element comprises a third antenna pin and a fourth antenna pin, the circuit board comprises a first line, a second line, a third line and a fourth line, and two ends of each of the first line, the second line, the third line and the fourth line are electrically connected to two metal pads, respectively, exposed on the circuit board;

a first conductive element comprising a first test pin and a first RF (Radio Frequency) pin;

a second conductive element comprising a second test pin and a second RF pin;

a third conductive element comprising a third test pin and a third RF pin; and a fourth conductive element comprising a fourth test pin and a fourth RF pin;

wherein when the antenna test assembly is in an equipment test mode, the first test pin and the first RF pin are electrically conducted to each other, the second RF pin and the second test pin are electrically conducted to each other, and the first test pin, the first RF pin, the first line, the first antenna pin, the second antenna pin, the second line, the second RF pin, the second test pin, the third test pin, the third RF pin, the third line, the third antenna pin, the fourth antenna pin, the fourth line, the fourth RF pin and the fourth test pin are electrically connected in sequence.

2. The antenna test assembly of claim 1, wherein when the antenna test assembly is in the equipment test mode, the second test pin and the third test pin are electrically connected in a conductive manner.

3. The antenna test assembly of claim 1, wherein the first antenna element and the second antenna element are the same and have an operating frequency in a range of 20 GHz to 100 GHz.

4. The antenna test assembly of claim 3, wherein the antenna module is a patch antenna array.

5. The antenna test assembly of claim 1, wherein the DUT further comprises an integrated circuit, and the first conductive element is a switch and further comprises a first IC pin;

wherein when the antenna test assembly is in an OTA (Over-The-Air) test mode, the first antenna pin, the first line, the first RF pin, the first IC pin, a line of the circuit board and a pin of the integrated circuit are electrically connected in sequence.

6. The antenna test assembly of claim 1, wherein one of the first antenna pin and the second antenna pin is a horizontal polarization pin, and the other of the first antenna pin and the second antenna pin is a vertical polarization pin.

7. An antenna test method, comprising:

providing a DUT, which comprises an antenna module and a circuit board, wherein the antenna module comprises a first antenna element and a second antenna element, the first antenna element comprises a first antenna pin and a second antenna pin, the second antenna element comprises a third antenna pin and a fourth antenna pin, the circuit board comprises a first line, a second line, a third line and a fourth line, and two ends of each of the first line, the second line, the third line and the fourth line are electrically connected to two metal pads, respectively, exposed on the circuit board;

providing a first conductive element, a second conductive element, a third conductive element and a fourth conductive element;

causing a first test pin and a first RF pin of the first conductive element to be electrically conducted to each other, causing a second test pin and a second RF pin of the second conductive element to be electrically conducted to each other, causing a third test pin and a third RF pin of the third conductive element to be electrically conducted to each other, and causing a fourth test pin and a fourth RF pin of the fourth conductive element to be electrically conducted to each other;

electrically connecting the second test pin and the third test pin in a conductive manner;

inputting a first RF signal into the first test pin;

causing the first RF signal to pass through an equipment test path formed in sequence by the first test pin, the first RF pin, the first line, the first antenna pin, the second antenna pin, the second line, the second RF pin, the second test pin, the third test pin, the third RF pin, the third line, the third antenna pin, the fourth antenna pin, the fourth line, the fourth RF pin and the fourth test pin, and causing the fourth test pin to output a signal parameter;

providing a signal standard range;

comparing the signal parameter and the signal standard range; and determining whether there is a poor connection on the equipment test path.

8. The antenna test method of claim 7, wherein the DUT further comprises an integrated circuit, and the antenna test method further comprises:

causing the first RF pin and a first IC pin of the first conductive element to be electrically conducted to each other;

causing the first antenna pin to receive a second RF signal;

causing the second RF signal to pass through an OTA test path formed in sequence by the first antenna pin, the first line, the first RF pin, the first IC pin, a line of the circuit board and a pin of the integrated circuit; and determining whether a characteristic of the first antenna element is normal.

* * * * *